US012672255B2

(12) United States Patent
He

(10) Patent No.: US 12,672,255 B2
(45) Date of Patent: Jun. 30, 2026

(54) AIRFLOW INTAKE VENT LOCATED PROXIMATE TO UPPER EDGE OF KEYBOARD

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 115 days.

(21) Appl. No.: 18/829,598

(22) Filed: Sep. 10, 2024

(65) Prior Publication Data

US 2026/0075748 A1     Mar. 12, 2026

(51) Int. Cl.
G06F 1/20     (2006.01)
H05K 7/20     (2006.01)

(52) U.S. Cl.
CPC ......... H05K 7/20172 (2013.01); G06F 1/203 (2013.01)

(58) Field of Classification Search
CPC ....... G06F 1/1662; G06F 1/1669; G06F 1/203
See application file for complete search history.

(56) References Cited

U.S. PATENT DOCUMENTS

| | | | | | |
|---|---|---|---|---|---|
| 5,121,291 A | * | 6/1992 | Cope | ...................... | G06F 1/206 |
| | | | | | 361/679.48 |
| 5,251,096 A | * | 10/1993 | Hosoi | ...................... | G06F 1/20 |
| | | | | | 361/679.5 |
| 5,331,508 A | * | 7/1994 | Hosoi | ................... | G06F 1/1662 |
| | | | | | 361/679.02 |
| 5,748,444 A | * | 5/1998 | Honda | ................... | G06F 1/203 |
| | | | | | 361/679.48 |
| 6,435,267 B1 | * | 8/2002 | Sterner | ................ | H01L 23/467 |
| | | | | | 165/185 |
| 6,577,502 B1 | * | 6/2003 | DiStefano | ............. | G06F 1/1677 |
| | | | | | 361/679.46 |
| 7,327,559 B2 | * | 2/2008 | Fox | ....................... | G06F 1/1616 |
| | | | | | 219/209 |
| 7,835,147 B2 | * | 11/2010 | Merz | ................. | G02F 1/133308 |
| | | | | | 361/679.34 |
| 8,081,479 B2 | * | 12/2011 | Tanaka | .................... | G06F 1/203 |
| | | | | | 361/730 |
| 8,964,383 B2 | * | 2/2015 | Degner | ................... | G06F 1/203 |
| | | | | | 361/679.48 |
| 9,280,177 B2 | * | 3/2016 | Degner | ................. | G06F 1/1613 |
| 9,575,524 B1 | * | 2/2017 | Prather | ................ | G06F 1/1662 |
| 10,146,190 B2 | | 12/2018 | Lovicott et al. | | |

(Continued)

*Primary Examiner* — Adrian S Wilson
(74) *Attorney, Agent, or Firm* — Jackson Walker L.L.P.

(57)     ABSTRACT

An information handling system may include an information handling resource, an air mover, and a housing configured to house the keyboard and the air mover. The housing may include a cover with an opening formed therein through which an information handling resource is accessible to a user of the information handling system, a support tray for mechanically supporting the information handling resource and positioning the information handling resource within the opening and relative to the cover, and a sidewall mechanically interfaced between the cover and the support tray, the sidewall having an airflow intake vent formed through the sidewall such that at least a portion of airflow driven by the air mover flows from outside the housing, then through the opening, then through the airflow intake vent.

19 Claims, 3 Drawing Sheets

(56)                References Cited

U.S. PATENT DOCUMENTS

| | | | | |
|---|---|---|---|---|
| 10,248,167 | B1 * | 4/2019 | Huang | G06F 1/1656 |
| 10,423,200 | B1 * | 9/2019 | North | G06F 1/1616 |
| 10,729,042 | B2 * | 7/2020 | Chang | H05K 7/20145 |
| 11,243,584 | B2 * | 2/2022 | Schnell | H05K 7/20727 |
| 11,429,164 | B1 * | 8/2022 | McKittrick | G06F 1/203 |
| 11,452,232 | B2 * | 9/2022 | Wong | G06F 1/203 |
| 11,599,163 | B2 * | 3/2023 | Grossmann | H05K 7/2039 |
| 12,029,006 | B2 * | 7/2024 | Williams | G06F 1/203 |
| 2002/0154474 | A1 * | 10/2002 | Merz | G02F 1/133308 |
| | | | | 361/679.55 |
| 2003/0011986 | A1 * | 1/2003 | Ariga | G06F 1/1616 |
| | | | | 361/679.17 |
| 2006/0039107 | A1 * | 2/2006 | Kumano | G06F 1/181 |
| | | | | 165/104.33 |
| 2006/0256519 | A1 * | 11/2006 | Fox | G06F 3/0202 |
| | | | | 361/679.48 |
| 2010/0067205 | A1 * | 3/2010 | Tanaka | G06F 1/1616 |
| | | | | 361/752 |
| 2010/0157523 | A1 * | 6/2010 | Kito | G06F 1/181 |
| | | | | 361/679.55 |
| 2012/0026677 | A1 * | 2/2012 | Bhutani | F04D 29/703 |
| | | | | 361/679.48 |
| 2013/0003280 | A1 * | 1/2013 | Degner | G06F 1/181 |
| | | | | 361/679.09 |
| 2013/0327507 | A1 * | 12/2013 | Degner | H05K 7/2039 |
| | | | | 361/695 |
| 2013/0329357 | A1 * | 12/2013 | Degner | F28D 15/02 |
| | | | | 165/104.21 |
| 2013/0329368 | A1 * | 12/2013 | Degner | F28D 15/0275 |
| | | | | 165/185 |
| 2014/0077670 | A1 * | 3/2014 | Degner | G06F 1/1616 |
| | | | | 29/592 |
| 2016/0047698 | A1 * | 2/2016 | Woo | G06F 1/203 |
| | | | | 700/300 |
| 2021/0223825 | A1 * | 7/2021 | Seiler | G06F 1/3215 |
| 2021/0329813 | A1 | 10/2021 | Shabbir et al. | |
| 2022/0382346 | A1 * | 12/2022 | Hampton | H05K 7/2039 |
| 2023/0081967 | A1 * | 3/2023 | He | G06F 1/203 |
| | | | | 361/695 |
| 2023/0186253 | A1 * | 6/2023 | Files | G06F 1/1616 |
| | | | | 705/308 |
| 2024/0032239 | A1 * | 1/2024 | Williams | G06F 1/206 |
| 2025/0060793 | A1 * | 2/2025 | Wang | G06F 1/1669 |
| 2025/0117043 | A1 * | 4/2025 | Smith | G06F 1/1618 |
| 2026/0023418 | A1 * | 1/2026 | McKittrick | G06F 1/203 |

* cited by examiner

AIRFLOW INTAKE VENT LOCATED PROXIMATE TO UPPER EDGE OF KEYBOARD

TECHNICAL FIELD

The present disclosure relates in general to information handling systems, and more particularly to cooling of information handling system components using one or more air movers with placement of an airflow intake vent located proximate to an upper edge of a keyboard.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

In conventional notebook computers (e.g., laptops), an air mover may draw air into an information handling system through intake vents formed in a bottom cover (e.g., on the "D-cover" of the notebook computer opposite a keyboard of the notebook computer) of a housing of the information handling system and located under the air mover. However, airflow vents on such a bottom cover may have high airflow impedance due to narrow gaps that may exist between the bottom cover and the table top or other surface the notebook computer may rest upon when in use.

SUMMARY

In accordance with the teachings of the present disclosure, the disadvantages and problems associated with traditional approaches to cooling information handling system components may be substantially reduced or eliminated.

In accordance with embodiments of the present disclosure, an information handling system may include an information handling resource, an air mover, and a housing configured to house the keyboard and the air mover. The housing may include a cover with an opening formed therein through which an information handling resource is accessible to a user of the information handling system, a support tray for mechanically supporting the information handling resource and positioning the information handling resource within the opening and relative to the cover, and a sidewall mechanically interfaced between the cover and the support tray, the sidewall having an airflow intake vent formed through the sidewall such that at least a portion of airflow driven by the air mover flows from outside the housing, then through the opening, then through the airflow intake vent.

In accordance with these and other embodiments of the present disclosure, a housing may include a cover with an opening formed therein through which an information handling resource is accessible to a user of the information handling resource, a support tray for mechanically supporting the information handling resource and positioning the information handling resource within the opening and relative to the cover, and a sidewall mechanically interfaced between the cover and the support tray, the sidewall having an airflow intake vent formed through the sidewall such that when air pressure inside the housing is lower than that outside the housing, air flows from outside the housing, then through the opening, then through the airflow intake vent.

In accordance with these and other embodiments of the present disclosure, a method for making a housing may include forming an opening in a cover of the housing through which an information handling resource is accessible to a user of the information handling resource, mechanically interfacing a sidewall between the cover and a support tray for mechanically supporting the information handling resource and for positioning the information handling resource within the opening and relative to the cover, and forming an airflow intake vent through the sidewall such that when air pressure inside the housing is lower than that outside the housing, air flows from outside the housing, then through the opening, then through the airflow intake vent.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
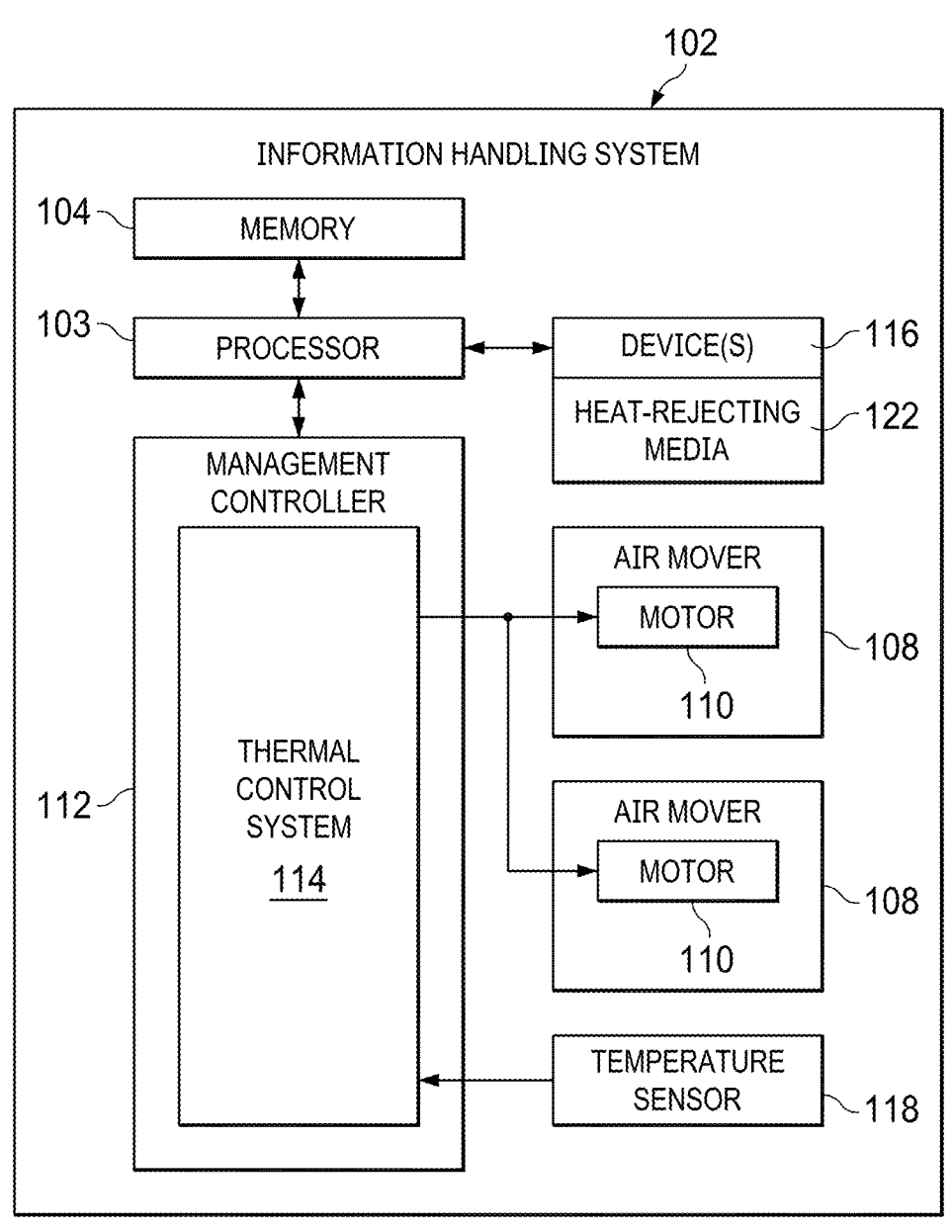
FIG. 1 illustrates a block diagram of selected components of an example information handling system, in accordance with embodiments of the present disclosure.
Figure 2:
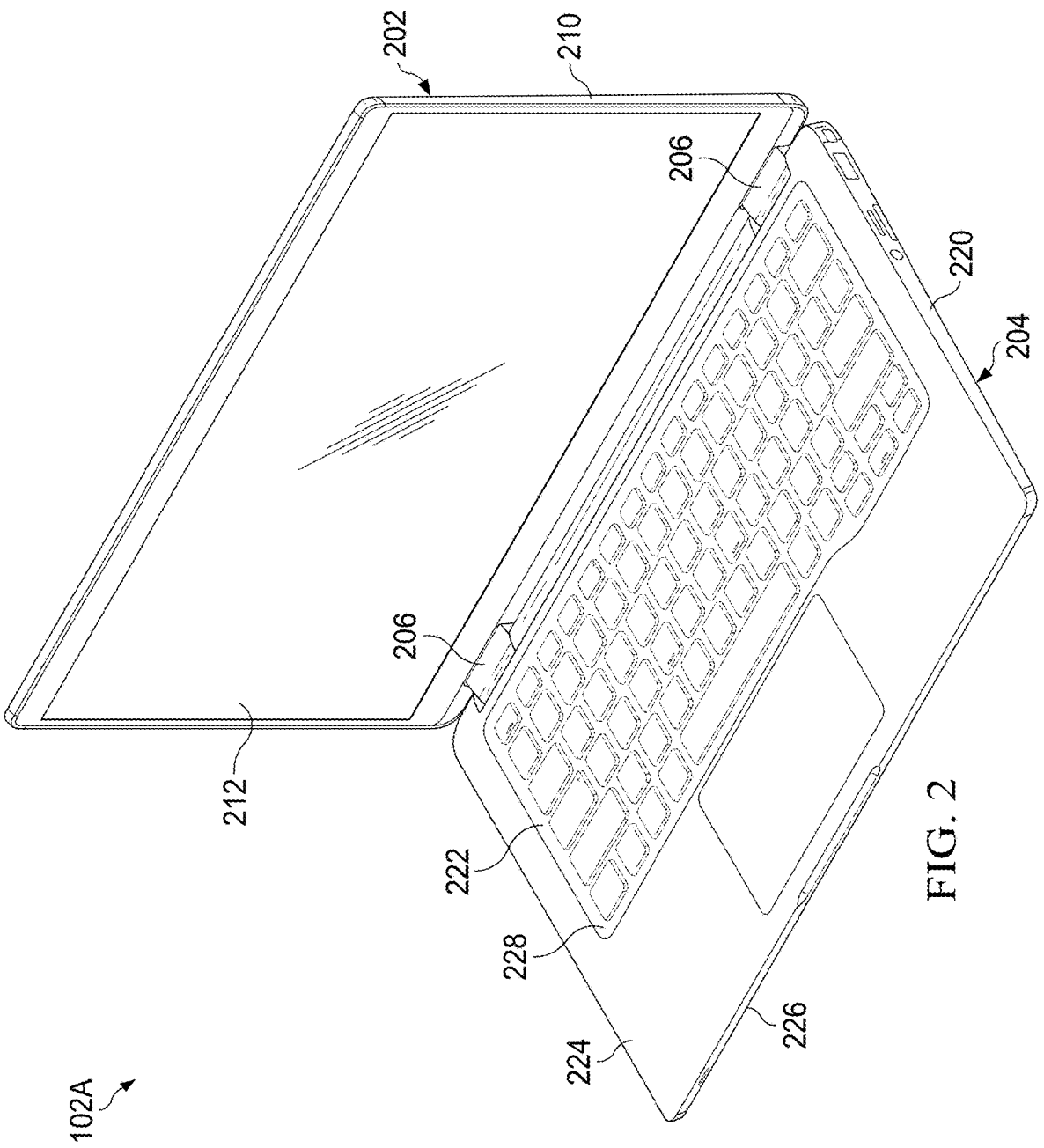
FIG. 2 illustrates selected components of an example notebook, in accordance with embodiments of the present disclosure.
Figure 3:
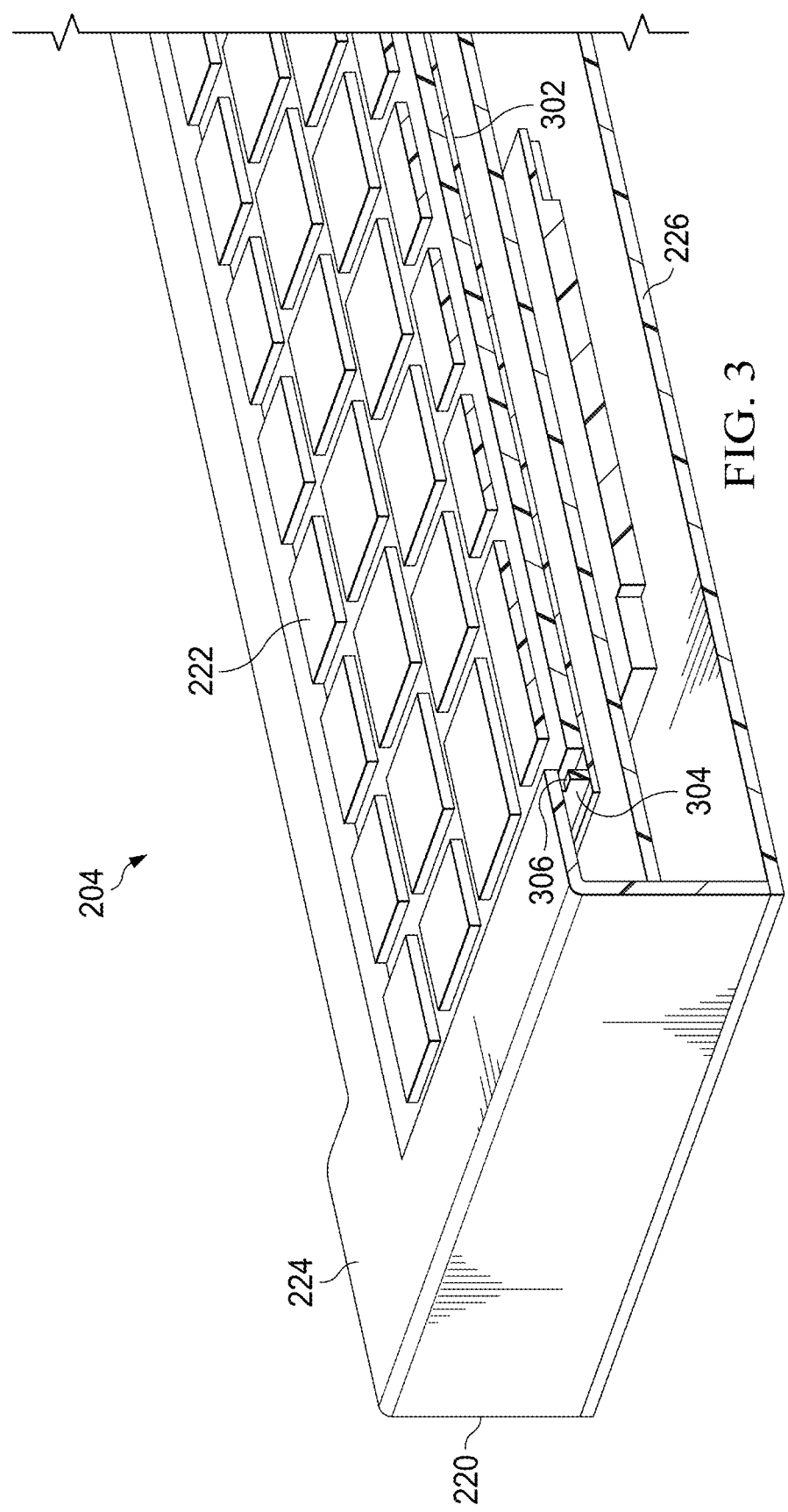
FIG. 3 illustrates an isometric perspective view of a keyboard assembly, with portions of the housing of the keyboard assembly cut away, depicting selected components of the notebook depicted in FIG. 2, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a block diagram of selected components of an example information handling system 102, in accordance with embodiments of the present disclosure. In some embodiments, information handling system 102 may comprise a server chassis configured to house a plurality of Servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may comprise a processor 103, a memory 104 communicatively coupled to processor 103, a plurality of air movers

108, a management controller 112, one or more devices 116 communicatively coupled to processor 103, a temperature sensor 118, and heat-rejecting media 122 thermally coupled to device(s) 116.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

An air mover 108 may include any mechanical or electro-mechanical system, apparatus, or device operable to move air and/or other gases in order to cool information handling resources of information handling system 102. In some embodiments, an air mover 108 may comprise a fan (e.g., a rotating arrangement of vanes or blades which act on the air). In other embodiments, an air mover 108 may comprise a blower (e.g., a centrifugal fan that employs rotating impellers to accelerate air received at its intake and change the direction of the airflow). In these and other embodiments, rotating and other moving components of an air mover 108 may be driven by a motor 110. The rotational speed of motor 110 may be controlled by an air mover control signal (e.g., a pulse-width modulation signal) communicated from thermal control system 114 of management controller 112. In operation, an air mover 108 may cool information handling resources of information handling system 102 by drawing cool air into an enclosure housing the information handling resources from outside the chassis, expelling warm air from inside the enclosure to the outside of such enclosure, and/or moving air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 118) and based on such one or more signals, calculate an air mover driving signal (e.g., a pulse-width modulation signal) to maintain an appropriate level of cooling, increase cooling, or decrease cooling, as appropriate, and communicate such air mover driving signal to air movers 108. Thermal control for air movers 108 by thermal control system 114 may be performed in any suitable manner, for example, as described in U.S. Pat. No. 10,146, 190 entitled "Systems and Methods for Providing Controller Response Stability in a Closed-Loop System."

In addition, thermal control system 114 may also be configured to maintain acoustic limits and/or maintain acoustic preferences for sound generated by air movers 108, for example, as described in U.S. patent application Ser. No. 16/852,118, filed Apr. 17, 2020, and entitled "Systems and Methods for Acoustic Limits of Thermal Control System in an Information Handling System," which is incorporated by reference herein in its entirety.

In some embodiments, thermal control system 114 may include a program of instructions (e.g., software, firmware) configured to, when executed by a processor or controller integral to management controller 112, carry out the functionality of thermal control system 114.

A device 116 may comprise any component information handling system of information handling system 102, including without limitation processors, buses, memories, I/O devices and/or interfaces, storage resources, network interfaces, motherboards, integrated circuit packages; electro-mechanical devices, displays, and power supplies.

Temperature sensor 118 may comprise any system, device, or apparatus (e.g., a thermometer, thermistor, etc.) configured to communicate a signal to thermal control system 114 indicative of a temperature within information handling system 102.

Heat-rejecting media 122 may include any system, device, or apparatus configured to transfer heat from an information handling resource (e.g., device(s) 116, as shown in FIG. 1), thus reducing a temperature of the information handling resource. For example, heat-rejecting media 122 may include one or more solids thermally coupled to the information handling resource (e.g., heat pipe, heat spreader, heatsink, finstack, etc.) such that heat generated by the information handling resource is transferred from the information handling resource. Further, heat-rejecting media 122 may be arranged to be located within the airflow path of airflow generated by air movers 108, such that heat transferred to heat-rejecting media 122 from device 116 may further be transferred to such airflow. Although, for purposes of clarity and exposition, heat-rejecting media 122 is shown as being thermally coupled to device(s) 116, it is understood that heat-rejecting media 122 may also be thermally coupled to other information handling resources (e.g., processor 103 and/or memory 104) of information handling system 102 in addition to or in lieu of being thermally coupled to device 116.

In addition to processor 103, memory 104, air mover 108, management controller 112, device(s) 116, temperature sensor 118, and heat-rejecting media 122, information handling system 102 may include one or more other information handling resources. In addition, for the sake of clarity and exposition of the present disclosure, FIG. 1 depicts two air movers 108 and one temperature sensor 118. In embodiments of the present disclosure, information handling system 102 may include any number of air movers 108 and temperature sensors 118.

FIG. 2 illustrates selected components of an example notebook 102A, in accordance with embodiments of the present disclosure. Notebook 102A may implement information handling system 102. As shown in FIG. 2, notebook 102A may include a display assembly 202 and a keyboard assembly 204 rotatably coupled to one another via one or more hinges 206. Display assembly 202 may comprise a housing 210 that may house components of notebook 102A including a display device 212 (e.g., liquid crystal display) for outputting alphanumeric and/or graphical output. Keyboard assembly 204 may comprise a housing 220 that may house components of notebook 102A including a keyboard 222 for inputting information to notebook 102A. Keyboard assembly 204 may also include other components of information handling system 102 (e.g., processor 103, memory 104, management controller 112, device(s) 116, air movers 108, temperature sensor 118, heat-rejecting media 122, etc.) not explicitly depicted in FIG. 2.

As further shown in FIG. 2, housing 220 may include a top cover 224 (e.g., a "C-cover") configured to mechanically couple to a bottom cover 226 (e.g., a "D-cover") for example by way of screws or fasteners. Top cover 224 may have an opening 228 formed therein through which keyboard 222 may be physically accessed by a user.

As discussed in the Background section above, in conventional notebook computers, air movers (e.g., air movers 108) may draw air into an information handling system housing (e.g., housing 220) through intake vents formed in a bottom cover (e.g., bottom cover 226) of such housing of the information handling system, and such airflow paths may have high airflow impedance due to narrow gaps that may exist between the bottom cover and the table top or other surface the notebook computer may rest upon when in use.

One potential solution to this disadvantage is the inclusion of airflow intake vents on the horizontal surface of top cover 224 or horizontal surface of keyboard 222, but such solutions may render components within housing 220 and below keyboard 222 susceptible to damage caused by liquid spills. Such liquid spill risk may be mitigated by waterproof membranes, but such waterproof membranes may also impose airflow resistance.

FIG. 3 illustrates an isometric perspective view of keyboard assembly 204, with portions of housing 220 cut away for purposes of clarity and exposition, depicting selected components of notebook 102A depicted in FIG. 2, in accordance with embodiments of the present disclosure.

As shown in FIG. 3, housing 220 may also include a horizontal keyboard support plate 302 mechanically coupled to a bottom side of top cover 224 via vertical sidewalls 304. Accordingly, keyboard support plate 302 may mechanically support a position of keyboard 222 relative to top cover 224.

As also shown in FIG. 3, sidewall 304 may have an airflow intake vent 306 formed through sidewall 304. In some embodiments, airflow intake vent 306 may comprise one or more holes or openings through sidewall 304. As depicted in FIG. 3, airflow intake vent 306 may be formed below top cover 224 but above keyboard support plate 302.

In some embodiments, airflow intake vent 306 may be formed immediately below top cover 224.

In operation, airflow driven by air movers 108 may be drawn into housing 220 via opening 228 and airflow intake vent 306. Thus, airflow intake vent 306 provides a horizontal path through which airflow may enter the interior of housing 220.

Among the advantages of the location of airflow intake vent 306 is that it may eliminate the need for the use of waterproof membranes which may introduce airflow impedance. Further, placement of airflow intake vent 306 proximate to top cover 224 may provide cooling to top cover 224 itself, which may minimize a "skin temperature" of cover 224 and in turn minimize discomfort a user may experience by coming into contact with top cover 224 with the user's fingers, hands, wrists, arms, or other body parts.

As used herein, the terms "horizontal" and "vertical" refer to orientations of components of notebook 102A when bottom cover 226 of notebook 102A is placed on a horizontal surface.

Airflow intake vent 306 shown and described above may be present within notebook 102A in lieu of or in addition to intake vents located elsewhere in housing 220.

While the terms "top," "bottom," "front," "back," and "side" are used for purposes of exposition and clarity, such terms are not intended to limit any of the components disclosed herein to a particular orientation or configuration.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
an information handling resource;
an air mover; and
a housing configured to house a housing configured to house the information handling resource and the air mover and comprising:
   a cover with an opening formed therein through which an information handling resource is accessible to a user of the information handling system;
   a support tray for mechanically supporting the information handling resource and positioning the information handling resource within the opening and relative to the cover; and
   a sidewall mechanically interfaced between the cover and the support tray, the sidewall having an airflow intake vent formed through the sidewall such that at least a portion of airflow driven by the air mover flows from outside the housing, then through the opening, then through the airflow intake vent.

2. The information handling system of claim 1, wherein the information handling resource is a keyboard.

3. The information handling system of claim 1, wherein the airflow intake vent comprises one or more holes formed through the sidewall.

4. The information handling system of claim 1, wherein the airflow intake vent is formed closer in proximity to the cover than the support tray.

5. The information handling system of claim 1, wherein the housing is a keyboard assembly of a notebook computer configured to rotationally couple to a display assembly via one or more hinges.

6. The information handling system of claim 1, wherein the housing is a keyboard assembly of a notebook computer, and the information handling system further comprises a display assembly rotationally coupled to the keyboard assembly via one or more hinges.

7. A housing comprising:
a cover with an opening formed therein through which an information handling resource is accessible to a user of the information handling resource;

9 a support tray for mechanically supporting the information handling resource and positioning the information handling resource within the opening and relative to the cover; and a sidewall mechanically interfaced between the cover and the support tray, the sidewall having an airflow intake vent formed through the sidewall such that when air pressure inside the housing is lower than that outside the housing, air flows from outside the housing, then through the opening, then through the airflow intake vent.

8. The housing of claim 7, wherein the information handling resource is a keyboard.

9. The housing of claim 7, wherein the airflow intake vent comprises one or more holes formed through the sidewall.

10. The housing of claim 7, wherein the airflow intake vent is formed closer in proximity to the cover than the support tray.

11. The housing of claim 7, wherein the housing is a keyboard assembly of a notebook computer configured to rotationally couple to a display assembly via one or more hinges.

12. A method for making a housing, comprising:

forming an opening in a cover of the housing through which an information handling resource is accessible to a user of the information handling resource;

mechanically interfacing a sidewall between the cover and a support tray for mechanically supporting the information handling resource and for positioning the information handling resource within the opening and relative to the cover; and

10 forming an airflow intake vent through the sidewall such that when air pressure inside the housing is lower than that outside the housing, air flows from outside the housing, then through the opening, then through the airflow intake vent.

13. The method of claim 12, wherein the information handling resource is a keyboard.

14. The method of claim 12, wherein forming the airflow intake vent comprises forming one or more holes formed through the sidewall.

15. The method of claim 12, further comprising forming the airflow intake vent is formed closer in proximity to the cover than the support tray.

16. The method of claim 12, wherein the housing is a keyboard assembly of a notebook computer and the method comprises configuring the keyboard assembly to rotationally couple to a display assembly via one or more hinges.

17. The method of claim 12, wherein the housing is a keyboard assembly of a notebook computer and the method further comprises rotationally coupling the keyboard assembly a display assembly via one or more hinges.

18. The method of claim 12, further comprising housing a keyboard within the housing by mechanically supporting the keyboard by the support tray.

19. The method of claim 12, further comprising housing an air mover in the housing configured to drive airflow to create air pressure inside the housing lower than that outside the housing.

* * * * *